United States Patent
Ko et al.

(10) Patent No.: US 9,279,673 B2
(45) Date of Patent: Mar. 8, 2016

(54) SEMICONDUCTOR DEVICE AND METHOD OF CALIBRATING WARPAGE TESTING SYSTEM TO ACCURATELY MEASURE SEMICONDUCTOR PACKAGE WARPAGE

(71) Applicant: STATS ChipPAC, Ltd., Singapore (SG)

(72) Inventors: WonJun Ko, Kyungki-Do (KR);
SeungYong Chai, Gyeonggi-do (KR);
OhHan Kim, Kyonggi-do (KR);
GwangTae Kim, Seoul (KR); Kenny Lee, Seoul (KR)

(73) Assignee: STATS ChipPAC, Ltd., Singapore (SG)

( * ) Notice: Subject to any disclaimer, the term of this patent is extended or adjusted under 35 U.S.C. 154(b) by 424 days.

(21) Appl. No.: 13/846,593

(22) Filed: Mar. 18, 2013

(65) Prior Publication Data

US 2014/0269810 A1    Sep. 18, 2014

(51) Int. Cl.
*G01K 15/00* (2006.01)
*G01N 25/72* (2006.01)
*G01N 3/20* (2006.01)
*G01B 11/30* (2006.01)
*H01L 21/66* (2006.01)

(52) U.S. Cl.
CPC ............... *G01B 11/306* (2013.01); *H01L 22/12* (2013.01)

(58) Field of Classification Search
USPC ...................... 374/1, 5, 57, 52, 141
See application file for complete search history.

(56) References Cited

U.S. PATENT DOCUMENTS

| | | | |
|---|---|---|---|
| 3,526,476 A * | 9/1970 | Sirtl | 423/88 |
| 5,009,512 A * | 4/1991 | Lessi et al. | 374/6 |
| 5,601,364 A * | 2/1997 | Ume | 374/57 |
| 6,123,452 A * | 9/2000 | Uchimura et al. | 374/57 |
| 6,896,403 B1 * | 5/2005 | Grau | 368/190 |
| 7,879,438 B2 | 2/2011 | Lin et al. | |
| 8,147,135 B2 * | 4/2012 | Shipley et al. | 374/57 |
| 2012/0077056 A1 | 3/2012 | Oda et al. | |
| 2012/0081702 A1 | 4/2012 | Yamada et al. | |
| 2013/0243029 A1 * | 9/2013 | Ramrattan et al. | 374/46 |

* cited by examiner

*Primary Examiner* — Mirellys Jagan
(74) *Attorney, Agent, or Firm* — Robert D. Atkins; Patent Law Group: Atkins and Associates, P.C.

(57) ABSTRACT

A warpage test system uses a calibration block to calibrate the warpage test system over a temperature profile. The calibration block includes a first metal block bonded to a second metal block. The first metal block includes a first metal and a second different metal. The first metal block includes a CTE different than a CTE of the second metal block. The calibration block is disposed in the warpage test system. A warpage of the calibration block is measured over a temperature profile ranging from 28° C. to 260° C. A deviation between the measured warpage of the calibration block and a known thermal expansion of the calibration block over the temperature profile is recorded. The warpage measurement in a semiconductor package is compensated by the deviation between the measured warpage of the calibration block and the known thermal expansion or warpage of the calibration block over the temperature profile.

25 Claims, 2 Drawing Sheets

SEMICONDUCTOR DEVICE AND METHOD OF CALIBRATING WARPAGE TESTING SYSTEM TO ACCURATELY MEASURE SEMICONDUCTOR PACKAGE WARPAGE

FIELD OF THE INVENTION

The present invention relates in general to semiconductor test systems and, more particularly, to a warpage test system and method of calibrating the warpage test system to accurately measure warpage in a semiconductor package.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

During the manufacturing of semiconductor packages, excess warpage of the semiconductor package can cause an open solder joint failure during reflow soldering. In the case of a package-on-package (PoP), the bond between the semiconductor packages typically uses paste printing and is particularly susceptible to warpage induced stress, resulting bond failure. Accordingly, it is important in manufacturing reliability to accurately measure warpage of the semiconductor package to identify units that exhibit excess warpage. The warpage of the semiconductor package can be measured on a warpage test system. The warpage test system is typically calibrated at room temperature with a calibration block. However, the calibration of the warpage test does not necessarily provide accurate warpage measurements across a broad temperature range. Some semiconductor packages which pass warpage test calibrated to room temperature can nonetheless be susceptible to warpage induced stress at high temperatures, resulting in bond failure between the semiconductor packages.

SUMMARY OF THE INVENTION

A need exists to accurately measure warpage of a semiconductor package across a temperature range. Accordingly, in one embodiment, the present invention is a method of calibrating a warpage test system comprising the step of providing a calibration block including a first metal block bonded to a second metal block. The first metal block includes a CTE different than a CTE of the second metal block. The method further includes the steps of disposing the calibration block in the warpage test system, measuring warpage of the calibration block over a temperature profile, and recording a deviation between the measured warpage of the calibration block and a known thermal expansion of the calibration block over the temperature profile.

In another embodiment, the present invention is a method of calibrating a semiconductor test system comprising the step of providing a calibration block including a first material block bonded to a second material block. The first material block includes a CTE different than a CTE of the second material block. The method further includes the steps of measuring warpage of the calibration block over a temperature profile, and recording a deviation between the measured warpage of the calibration block and a known thermal expansion of the calibration block over the temperature profile.

In another embodiment, the present invention is a method of calibrating a semiconductor test system comprising the steps of providing a calibration block including a first metal block bonded to a second metal block, measuring warpage of the calibration block over a temperature profile, and recording a deviation between the measured warpage of the calibration block and a known thermal expansion of the calibration block over the temperature profile.

In another embodiment, the present invention is a warpage test system for a semiconductor package comprising a base and calibration block disposed over the base. The calibration block includes a first metal block bonded to a second metal block with the first metal block including a CTE different than a CTE of the second metal block. A warpage detection module measures warpage of the calibration block over a temperature profile. The warpage test system records a deviation between the measured warpage of the calibration block and a known thermal expansion of the calibration block over the temperature profile.

DETAILED DESCRIPTION OF THE DRAWINGS

Figure 1:
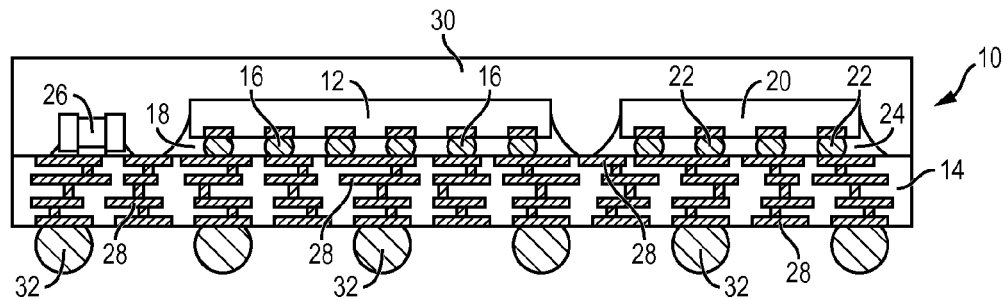
FIG. 1 illustrates a semiconductor device.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 shows a semiconductor package 10 including semiconductor die 12 mounted to substrate 14 with bumps 16. An underfill material 18 is deposited between semiconductor die 12 and substrate 14. Likewise, semiconductor die 20 is mounted to substrate 14 with bumps 22. An underfill material 24 is deposited between semiconductor die 20 and substrate 14. Discrete semiconductor device 26, e.g., an inductor, capacitor, resistor, transistor, or diode, is mounted to substrate 14. Substrate 14 includes conductive traces 28 for lateral and vertical interconnect through the substrate. Bumps 16 and 22, as well as discrete semiconductor device 26, are metallurgically bonded and electrically coupled to conductive traces 28 in substrate 14. An encapsulant 30 is deposited over semiconductor die 12 and 20 and discrete semiconductor device 26. Bumps 32 are formed over a surface of substrate 14 opposite semiconductor die 12 and 20 for electrical interconnect.

Semiconductor package 10 is subject to warpage during the manufacturing process due to differences in coefficient of thermal expansion (CTE) of dissimilar materials in the semiconductor package. To maintain a high yield and reduce manufacturing and latent defects, semiconductor package 10 is measured to determine the extent of any warpage that has been introduced into the package during the manufacturing process due to differences in CTE of dissimilar materials in the semiconductor package.

Figure 2:
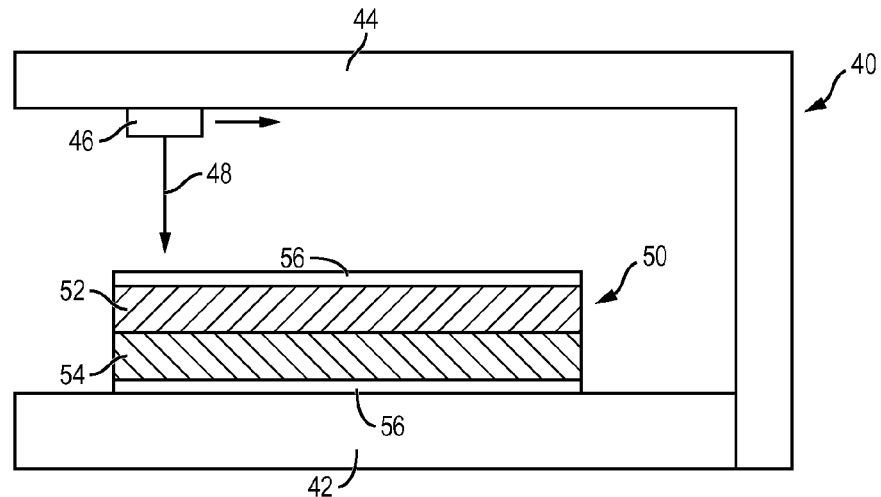
FIG. 2 illustrates a warpage test system with a warpage calibration block for calibrating the warpage test system.

FIG. 2 illustrates a warpage test system 40 for measuring the warpage of semiconductor package 10. Warpage test system 40 includes a base or shelf 42 for placement of the semiconductor package to be measured, i.e., unit under test (UUT), during normal operation. A support structure 44 extends from base 42 over the area of the base designated for the UUT. A warpage detection module 46 is moveably mounted to support structure 44. Warpage detection module 46 moves in an x-y direction parallel to the surface of the UUT and emits a laser beam 48 to the UUT to detect irregularity in the surface planarity or warpage of the UUT. Laser beam 48 measures the distance between warpage detection module 46 and UUT. The distance should remain constant in an ideal planar surface. Any variation in the distance is indicative of warpage in the UUT. Alternatively, warpage detection module 46 may use a rod extending from the module that contacts the surface of the UUT. Any variation in the distance as determined by vertical movement of the rod is indicative of warpage in the UUT.

Temperature cycling is another variable in the warpage testing operation. The UUT exhibits thermal expansion and contraction in response to changing temperatures according to the CTE of the materials within the UUT. Temperature affects the amount of thermal expansion, which in turn affects the warpage measurement. Accordingly, warpage test system 40 is calibrated over a range of temperatures to compensate for thermally induced variation in warpage measurement of the UUT.

To perform the calibration, warpage calibration block 50 is disposed on base 42 of warpage test system 40. Calibration block 50 includes two dissimilar materials bonded together with dimensions approximately the same as semiconductor package 10. In one embodiment, calibration block 50 includes a first metal block 52 containing a first metal selected from Table 1 and second metal block 54 containing a second different metal selected from Table 1. Metal block 52 and metal block 54 are selected to have different CTEs.

TABLE 1

Materials for Calibration Block

| Material | Linear Coefficient α @ 20° C. 10 exp(−6)/° C. | Volumetric Coefficient β @ 20° C. 10 exp(−6)/° C. |
| --- | --- | --- |
| Aluminium | 23 | 69 |
| Copper | 17 | 51 |
| Diamond | 1 | 3 |
| Glass | 8.5 | 25.5 |
| Gold | 14 | 42 |
| Iron | 11.8 | 33.3 |
| Lead | 29 | 87 |
| Molybdenum | 4.8 | 14.4 |
| Nickel | 13 | 39 |
| Platinum | 9 | 27 |
| Fused Quartz | 0.59 | 1.77 |
| Rubber | 77 | 231 |
| Sapphire | 5.3 | |
| Silicon Carbide | 2.77 | 8.31 |
| Silicon | 3 | 9 |
| Silver | 18 | 54 |
| Stainless Steel | 17.3 | 51.9 |
| Steel | 11.0-13.0 | 33.0-39.0 |
| Titanium | 8.6 | |
| Tungsten | 4.5 | 13.5 |

In another embodiment, calibration block 50 includes other dissimilar materials bonded together, such as e-plated metal and second metal, first ceramic and second ceramic, ceramic and metal, first polymer and second polymer, or other materials selected from Table 1. In each case, the bonded materials have different CTEs.

Figure 3:
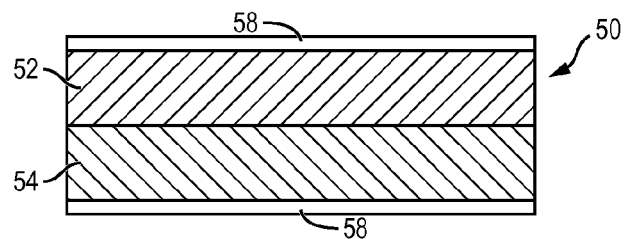
FIG. 3 illustrates another embodiment of the warpage calibration block.

A matte finish 56 is formed as a protective layer over opposing surfaces of calibration block 50. Alternatively, a solder mask 58 is formed as a protective layer over opposing surfaces of calibration block 50, as shown in FIG. 3.

Warpage calibration block 50 is exposed to a temperature profile while undergoing calibration on warpage test system 40. In one embodiment, the temperature ramps up from 28° C. to 260° C. and then ramps down to 32° C. The temperature profile may change continuously or hold at discrete selected temperatures for a period of time to reach steady state of thermal expansion for calibration block 50. An example of the discrete steps of the temperature profile is 28° C., 50° C., 100° C., 150° C., 183° C., 217° C., 245° C., 260° C., 245° C., 217° C., 183° C., 150° C., 100° C., 50° C., and 32° C., with each temperature point being held for a time to reach steady state of thermal expansion of calibration block 50, e.g. 30-140 seconds from the temperature profile in Table 2.

TABLE 2

Temperature Profile

| Temp ° C. | Minimum elapsed time (seconds) | Maximum elapsed time (seconds) |
| --- | --- | --- |
| 28 | 0 | 0 |
| 50 | 30 | 140 |
| 100 | 60 | 280 |
| 150 | 90 | 420 |
| 183 | 120 | 560 |
| 217 | 150 | 700 |
| 245 | 180 | 840 |
| 260 | 210 | 980 |
| 245 | 240 | 1120 |
| 217 | 270 | 1260 |
| 183 | 300 | 1400 |
| 150 | 330 | 1540 |
| 100 | 360 | 1680 |
| 50 | 390 | 1820 |
| 32 | 420 | 1960 |

The composition of materials in calibration block 50, CTEs of metal blocks 52-54, and time at each temperature point are given by way of example. Other materials, CTEs, and time periods are within the scope of the present disclosure.

In performing the calibration of warpage test system 40 over the temperature profile, calibration block 50 is exposed to the first temperature profile point of 28° C. Metal block 52 exhibits a known thermal expansion based on its CTE at the first temperature profile point of 28° C. Likewise, metal block 54 exhibits a known thermal expansion based on its CTE at the first temperature profile point of 28° C. Since metal block 52 and metal block 54 are bonded together, the different CTEs of the metal blocks will cause calibration block 50 to warp in a concave or convex manner, depending on whether the CTE of metal block 52 is greater than or less than the CTE of metal block 54. If the CTE of metal block 52 is less than the CTE of metal block 54, then metal block 54 expands more than metal block 52 and calibration block 50 will concave with respect to base 42. If the CTE of metal block 52 is greater than the CTE of metal block 54, then metal block 52 expands more than metal block 54 and calibration block 50 will convex with respect to base 42. The amount of the concave or convex warpage that calibration block 50 will exhibit can be determined with high accuracy, certainty, and repeatability, given the temperature and the CTEs of metal blocks 52-54. That is, the amount of warpage in calibration block 50 at each point on the surface of the calibration block is known from the physical nature of metal blocks 52-54 at a given temperature.

When calibration block 50 reaches a steady state expansion of metal blocks 52-54 at the first temperature profile point of 28° C., warpage detection module 46 moves in x-y directions across the surface of the calibration block. Warpage test system 40 takes a plurality of measurements at test points across the surface of calibration block 50. More specifically, warpage detection module 46 moves to a location above a first test point on the surface of calibration block 50 and laser beam 48 measures the distance to the first test point. Warpage detection module 46 moves to a location above a second test point on the surface of calibration block 50 and laser beam 48 measures the distance to the second test point. The process continues as warpage detection module 46 moves in x-y directions across the surface of calibration block 50 and laser beam 48 continues to measure distances to a number of test points. The collection of measurements made by laser beam 48 defines the measured warpage of calibration block 50 as caused by the thermal expansion of metal blocks 52-54 at the first temperature profile point of 28° C.

Recall that the actual warpage of calibration block 50 at each test point on the surface at the first temperature profile point of 28° C. is known or can be determined based on the temperature and the CTEs of metal block 52 and metal block 54. The difference between the measured warpage of calibration block 50 and the actual warpage of the calibration block at each of the test points at the first temperature profile point of 28° C. defines the calibration deviation of warpage test system 40 for that temperature profile point. A minimum deviation, maximum deviation, average deviation, standard deviation, CPK, and tolerance of the warpage can be determined from the collection of measurements. Warpage test system 40 records the calibration deviation between the measured warpage and the actual warpage of calibration block 50 at the first temperature profile point of 28° C.

Next, calibration block 50 is exposed to the second temperature profile point of 50° C. Metal block 52 exhibits a known thermal expansion based on its CTE at the second temperature profile point of 50° C. Likewise, metal block 54 exhibits a known thermal expansion based on its CTE at the second temperature profile point of 50° C. Since metal block 52 and metal block 54 are bonded together, the different CTEs of the metal blocks will cause calibration block 50 to warp in a concave or convex manner, depending on whether the CTE of metal block 52 is greater than or less than the CTE of metal block 54. The amount of the concave or convex warpage that calibration block 50 will exhibit can be determined with high accuracy, certainty, and repeatability, given the temperature and the CTEs of metal blocks 52-54.

When calibration block 50 reaches a steady state expansion of metal blocks 52-54 at the second temperature profile point of 50° C., warpage detection module 46 moves in x-y directions across the surface of the calibration block. Warpage test system 40 takes a plurality of measurements at test points across the surface of calibration block 50. More specifically, warpage detection module 46 moves to a location above a first test point on the surface of calibration block 50 and laser beam 48 measures the distance to the first test point. Warpage detection module 46 moves to a location above a second test point on the surface of calibration block 50 and laser beam 48 measures the distance to the second test point. The process continues as warpage detection module 46 moves in x-y directions across the surface of calibration block 50 and laser beam 48 continues to measure distances to a number of test points. The collection of measurements made by laser beam 48 defines the measured warpage of calibration block 50 as caused by the thermal expansion of metal blocks 52-54 at the second temperature profile point of 50° C.

The difference between the measured warpage of calibration block 50 and the actual warpage of the calibration block at each of the test points at the second temperature profile point of 50° C. defines the calibration deviation of warpage test system 40 for that temperature profile point. A minimum deviation, maximum deviation, average deviation, standard deviation, CPK, and tolerance of the warpage can be determined from the collection of measurements. Warpage test system 40 records the calibration deviation between the measured warpage and the actual warpage of calibration block 50 at the second temperature profile point of 50° C.

Figure 4:
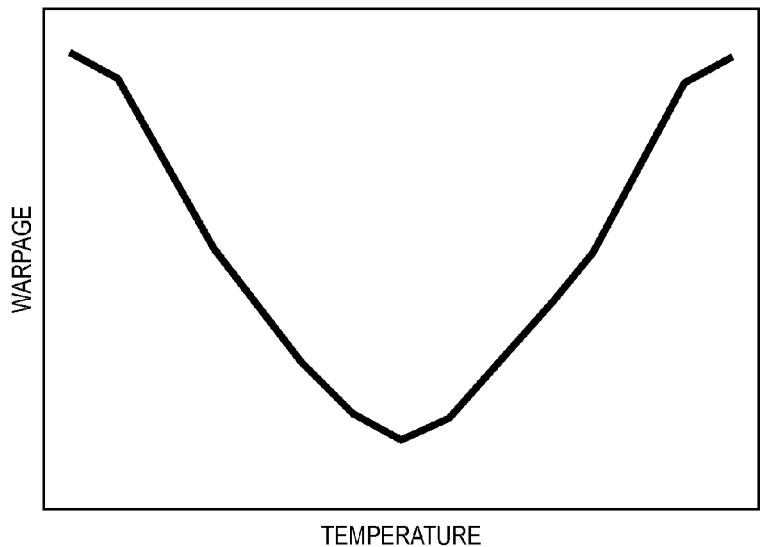
FIG. 4 illustrates a graph of deviation between the measured warpage and known thermal expansion of the calibration block across a temperature profile.

The above warpage measurement process is repeated for each of the temperature profile points. At each temperature profile point, the difference between the actual warpage of calibration block 50 and the measured warpage of the calibration block defines the calibration deviation of warpage test system 40 for that temperature profile point. Warpage test system 40 records the calibration deviation between the measured warpage and the actual warpage of calibration block 50 at each temperature profile point, as shown in FIG. 4. Given the deviation between the measured warpage and the known thermal expansion or warpage of calibration block 50 across the temperature profile, warpage test system 40 can be calibrated to compensate for the warpage measurement deviation across the temperature profile. The calibration process can also compensate for coplanarity measurements.

Figure 5:
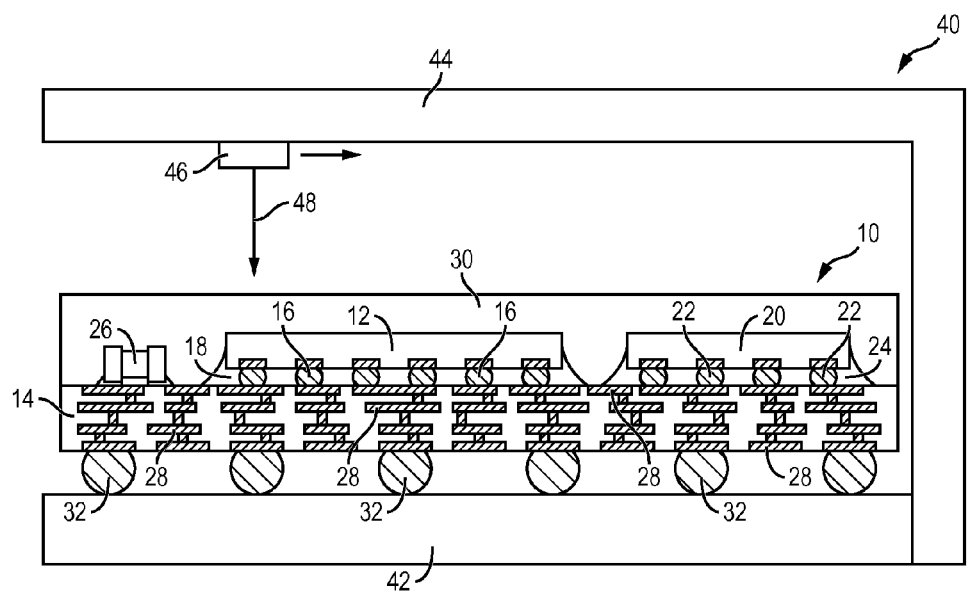
FIG. 5 illustrates the semiconductor device being tested with warpage test system that has been calibrated with a warpage calibration block across a temperature profile.

FIG. 5 shows semiconductor package 10 disposed on base 42 of warpage test system 40 in order to perform warpage test measurements with warpage test system 40 after the above described calibration across the temperature profile. Semiconductor package 10 is measured to determine the extent of any warpage that has been introduced into the package during the manufacturing process due to differences in CTE of dissimilar materials in the semiconductor package. A plurality of measurements is taken by warpage test system 40 at a plurality of test points across the surface of semiconductor package 10. Given the temperature of semiconductor package 10 during the warpage test, the warpage measurement taken by warpage detection module 46 can be compensated to increase the accuracy of the warpage test. For example, if semiconductor package 10 is being tested at 150° C., then the measured warpage as determined by warpage detection module 46 is compensated by the calibrated measurement deviation at 150° C. If the measured warpage in semiconductor package 10 at a given temperature is known to be off by an amount as determined by the calibration, then the measured warpage of the semiconductor package is adjusted by the calibrated deviation for that temperature. The compensated warpage measurement for semiconductor package 10 increases the accuracy of the warpage test and reduces manufacturing and latent defects. A semiconductor package that exceeds a maximum acceptable threshold warpage can be removed from the manufacturing process to increase yield and reliability of the remaining semiconductor packages that pass warpage testing.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of calibrating a warpage test system, comprising:
   providing a calibration block including a first metal block bonded to a second metal block, wherein the first metal block includes a coefficient of thermal expansion (CTE) different from a CTE of the second metal block;
   disposing the calibration block in the warpage test system;
   measuring warpage of the calibration block over a temperature profile; and
   recording a deviation between the measured warpage of the calibration block and a known thermal expansion of the calibration block over the temperature profile, wherein the deviation provides a calibration of the warpage test system.

2. The method of claim 1, wherein the first metal block and second metal block are selected from the group consisting of aluminum, copper, gold, iron, lead, molybdenum, nickel, platinum, silver, stainless steel, steel, titanium, and tungsten.

3. The method of claim 1, further including forming a matte finish over the calibration block.

4. The method of claim 1, further including forming a solder mask over the calibration block.

5. The method of claim 1, wherein the temperature profile ranges from 28° C. to 260° C.

6. The method of claim 1, further including compensating a warpage measurement in a semiconductor package by the deviation between the measured warpage of the calibration block and the known thermal expansion of the calibration block over the temperature profile.

7. A method of calibrating a semiconductor test system, comprising:
provided a calibration block including a first material block bonded to a second material block, wherein the first material block includes a coefficient of thermal expansion (CTE) different from a CTE of the second material block;
measuring warpage of the calibration block over a temperature profile; and
recording a deviation between the measured warpage of the calibration block and a known thermal expansion of the calibration block over the temperature profile, wherein the deviation provides a calibration of the semiconductor test system.

8. The method of claim 7, wherein the first material block and second material block are selected from the group consisting of aluminum, copper, diamond, glass, gold, iron, lead, molybdenum, nickel, platinum, fused quartz, rubber, sapphire, silicon carbide, silicon, silver, stainless steel, steel, titanium, and tungsten.

9. The method of claim 7, further including measuring the warpage of the calibration block using a laser.

10. The method of claim 7, further including forming a protective layer over the calibration block.

11. The method of claim 7, wherein the temperature profile ranges from 28° C. to 260° C.

12. The method of claim 7, further including disposing a semiconductor package in the semiconductor test system to measure warpage.

13. The method of claim 12, further including compensating a warpage measurement in the semiconductor package by the deviation between the measured warpage of the calibration block and the known thermal expansion of the calibration block over the temperature profile.

14. A method of calibrating a semiconductor test system, comprising:
providing a calibration block including a first metal block bonded to a second metal block;
measuring warpage of the calibration block over a temperature profile; and
recording a deviation between the measured warpage of the calibration block and a known thermal expansion of the calibration block over the temperature profile, wherein the deviation provides a calibration of the semiconductor test system.

15. The method of claim 14, wherein the first metal block and second metal block are selected from the group consisting of aluminum, copper, gold, iron, lead, molybdenum, nickel, platinum, silver, stainless steel, steel, titanium, and tungsten.

16. The method of claim 14, wherein the first metal block includes a coefficient of thermal expansion (CTE) different from a CTE of the second metal block.

17. The method of claim 14, wherein the temperature profile ranges from 28° C. to 260° C.

18. The method of claim 14, further including measuring the warpage of the calibration block using a laser.

19. The method of claim 14, further including disposing a semiconductor package in the semiconductor test system to measure warpage.

20. The method of claim 19, further including compensating a warpage measurement in the semiconductor package by the deviation between the measured warpage of the calibration block and the known thermal expansion of the calibration block over the temperature profile.

21. A warpage test system for a semiconductor package, comprising:
a base;
a calibration block disposed over the base, the calibration block including a first metal block bonded to a second metal block with the first metal block including a coefficient of thermal expansion (CTE) different from a CTE of the second metal block; and
a warpage detection module for measuring warpage of the calibration block over a temperature profile,
wherein warpage test system records a deviation between the measured warpage of the calibration block and a known thermal expansion of the calibration block over the temperature profile.

22. The warpage test system of claim 21, wherein the calibration block includes materials selected from the group consisting of aluminum, copper, diamond, glass, gold, iron, lead, molybdenum, nickel, platinum, fused quartz, rubber, sapphire, silicon carbide, silicon, silver, stainless steel, steel, titanium, and tungsten.

23. The warpage test system of claim 21, further including a laser for measuring the warpage of the calibration block.

24. The warpage test system of claim 21, wherein the temperature profile ranges from 28° C. to 260° C.

25. The warpage test system of claim 21, further including a semiconductor package disposed over the base, wherein a warpage measurement in the semiconductor package is compensated by the deviation between the measured warpage of the calibration block and the known thermal expansion of the calibration block over the temperature profile.

* * * * *